United States Patent [19]

Kelly et al.

[11] Patent Number: 4,588,670
[45] Date of Patent: May 13, 1986

[54] LIGHT-SENSITIVE TRISESTER OF O-QUINONE DIAZIDE CONTAINING COMPOSITION FOR THE PREPARATION OF A POSITIVE-ACTING PHOTORESIST

[75] Inventors: Michael Kelly, Coventry, R.I.; Donald C. Mammato, Lebanon; Dana Durham, Bloomsbury, both of N.J.; Sangya Jain, Hillsborough, N.J.; Lawrence Crane, Tustin, Calif.

[73] Assignee: American Hoechst Corporation, Somerville, N.J.

[21] Appl. No.: 706,817

[22] Filed: Feb. 28, 1985

[51] Int. Cl.$^4$ .................. G03C 1/54; G03C 1/60; G03C 1/76
[52] U.S. Cl. .................. 430/165; 430/166; 430/192; 430/193; 430/326; 534/556; 534/561
[58] Field of Search .................. 430/192, 193, 165; 534/556, 558, 561

[56] References Cited

U.S. PATENT DOCUMENTS

| | | | |
|---|---|---|---|
| 3,201,239 | 8/1965 | Neugebauer | 430/165 |
| 3,666,473 | 5/1972 | Colom et al. | 430/192 |
| 4,115,128 | 9/1978 | Kita | 430/191 |
| 4,174,222 | 11/1979 | Komine et al. | 430/190 |
| 4,407,926 | 10/1983 | Stahlhofer | 430/192 |
| 4,409,314 | 10/1983 | Buhr et al. | 430/192 |
| 4,499,171 | 2/1985 | Hosaka et al. | 430/193 |

FOREIGN PATENT DOCUMENTS 92444 10/1983 European Pat. Off. ............ 430/192

Primary Examiner—Charles L. Bowers, Jr.
Attorney, Agent, or Firm—Richard S. Roberts; James R. Cartiglia

[57] ABSTRACT

A light sensitive composition for the preparation of a positive acting photoresist which is a mixture of an alkali soluble resin and a compound of the formula

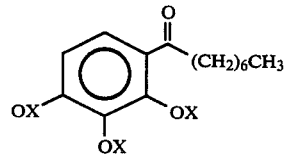

wherein X is a naphthoquinone-(1,2)-diazide-(2)-sulfonyl residue.

17 Claims, No Drawings

LIGHT-SENSITIVE TRIESTER OF O-QUINONE DIAZIDE CONTAINING COMPOSITION FOR THE PREPARATION OF A POSITIVE-ACTING PHOTORESIST

BACKGROUND OF THE INVENTION

The present invention relates generally to radiation sensitive positive photoresist compositions and particularly to compositions containing novolak resins together with naphthoquinone diazide sensitizing agents.

It is well known in the art to produce positive photoresist formulations such as those described in U.S. Pat. Nos. 3,666,473 and 4,409,314 and European patent application No. 0092444. These include alkali-soluble phenol-formaldehyde novolak resins together with light-sensitive materials, usually a substituted naphthoquinone diazide compound. The resins and sensitizers are dissolved in an organic solvent or mixture of solvents and are applied as a thin film or coating to a substrate suitable for the particular application desired.

The novolak resin component of these photoresist formulations is soluble in aqueous alkaline solutions, but the naphthoquinone sensitizer acts as a dissolution inhibitor with respect to the resin. Upon exposure of selected areas of the coated substrate to actinic radiation, however, the sensitizer undergoes a radiation induced structural transformation and the exposed areas of the coating are rendered more soluble than the unexposed areas. This difference in solubility rates causes the exposed areas of the photoresist coating to be dissolved when the substrate is immersed in alkaline developing solution while the unexposed areas are largely unaffected, thus producing a positive relief pattern on the substrate.

In most instances, the exposed and developed substrate will be subjected to treatment by a substrate-etchant solution. The photoresist coating protects the coated areas of the substrate or substrate etchant plasma from the etchant and thus the etchant is only able to etch the uncoated areas of the substrate, which in the case of a positive photoresist, corresponds to the areas which were exposed to actinic radiation. Thus, an etched pattern can be created on the substrate which corresponds to the pattern of the mask, stencil, template, etc., that was used to create selective exposure patterns on the coated substrate prior to development.

The relief pattern of photoresist on substrate produced by the method described above is useful for various applications including, for example, as an exposure mask or a pattern such as is employed in the manufacture of miniaturized integrated electronic components.

The properties of a photoresist composition which are important in commercial practice include the photospeed of the resist, development contrast, resist resolution and resist adhesion.

Increased photospeed is important for a photoresist, particularly in applications where light of reduced intensity is employed such as in projection exposure techniques where the light is passed through a series of lenses and mono-chromatic filters.

Development contrast is a measure of the photoresist's ability to faithfully transfer the mask dimensions through the entire thickness of the photoresist. Ideally the opening at the top of the photoresist film should have the same dimensions as the bottom of the film. A resist with improved contrast has improved edge acuity.

Resist resolution refers to the capability of a resist system to reproduce the smallest equally spaced line pairs and intervening spaces of a mask which is utilized during exposure with a high degree of image edge acuity in the developed exposure spaces.

In many industrial applications, particularly in the manufacture of miniaturized electronic components, a photoresist is required to provide a high degree of resolution for very small line and space widths (on the order of one micron or less).

The ability of a resist to reproduce very small dimensions, on the order of a micron or less, is extremely important in the production of large scale integrated circuits on silicon chips and similar components. Circuit density on such a chip can only be increased, assuming photolithography techniques are utilized, by increasing the resolution capabilities of the resist.

The present invention provides an improved positive working photoresist composition which demonstrates substantially increased contrast while retaining or improving the resist photospeed in the near-UV region.

SUMMARY OF THE INVENTION

The present invention relates to a positive-acting photoresist. More particularly, it relates to a light-sensitive composition for the preparation of a positive-acting photoresist which is a mixture of an alkali soluble resin and a compond of the formula

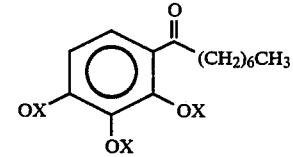

where X is a naphthoquinone-(1,2)-diazide-(2)-sulfonyl residue.

DETAILED DESCRIPTION OF THE INVENTION

The present invention provides a light-sensitive composition for the preparation of a positive-acting photoresist which is a mixture of an alkali soluble resin and a naphthoquinone derivative of the formula I

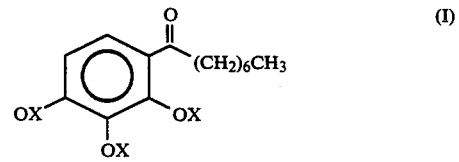

wherein X is a naphthoquinone-(1,2)-diazide-(2)-sulfonyl residue.

The naphthoquinone derivatives contained in the composition according to this invention are prepared by methods known to those skilled in the art such as, for example, by combining one mole of the trihydroxyphenyl heptyl ketone compound of formula II

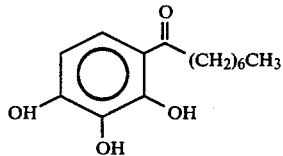

(II)

and three moles of naphthoquinone-(1,2)-diazide-(2)-sulfonyl chloride in an inert solvent in the presence of a mild base. Trihydroxyphenyl alkyl ketones are prepared by methods known to those skilled in the art such as, for example, by allowing pyrogallol to react with the appropriate aliphatic acid or acid chloride in the presence of an appropriate catalyst with or without an appropriate solvent according to the formula

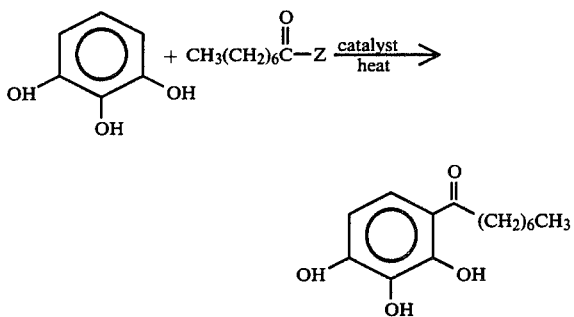

wherein Z is chlorine or hydroxyl. Appropriate catalysts for the reaction include aluminum chloride, boron trifluoride, fused zinc chloride, trifluoromethane sulfonic acid and polyphosphoric acid. Appropriate solvents for the reaction include ether, 1,2,-dichloroethane, methylene chloride and anisole.

The naphthoquinone-(1,2)-diazide-(2)-sulfonyl residue of X may be either a naphthoquinone-(1,2)-diazide-(2)-4-sulfonyl residue or a naphthoquinone-(1,2)-diazide-(2)-5-sulfonyl residue. Preferably, X is a naphthoquinone-(1,2)-diazide-(2)-5-sulfonyl residue.

The resin of this invention is a polymeric, water-insoluble resinous binder which dissolves in the solvents used for the mixture of the invention and is also soluble or at least swellable in aqueous alkaline solutions. Preferably, the resin is a hydroxy aryl-based resin such as a novolak or polyvinyl phenol resin. Most preferably, the resin is a cresol novolak resin. Such resins promote a sharp differentiation between the exposed and unexposed areas of the photoresist upon developing. The production of such novolak resins is by means well known in the art. An exemplary procedure for their manufacture is described in *Chemistry and Application of Phenolic Resins,* Knop, A. and Scheib, W., Springer Verlag, New York, 1979 in Chapter 4 which is hereby incorporated herein by reference.

In preparing the photosensitive coating solution used to form a photoresist, the amount of naphthoquinone derivative used is varied until a certain absorbtivity of the solution is observed. Preferably, the absorbtivity is from about 0.5 to about 1.5 liters/g-cm. More preferred is an absorbtivity from about 0.6 to about 0.9 liters/g-cm.

In order to do so, the naphthoquinone derivatives of this invention are preferably mixed with the alkali soluble resin in a ratio of at least about 1:1 up to the ratio of about 1.10 by weight and most preferably from about 1:6 to about 1:10 by weight.

Additives such as colorants, dyes, anti-striation agents, plasticizers, adhesion promoters, speed enhancers, solvents and such surfactants as non-ionic surfactants may be added to the solution of resin, sensitizer and solvent before the solution is coated onto a substrate.

Examples of dye additives that may be used together with the photoresist compositions of the present invention include Methyl Violet 2B (C.I. No. 42535), Crystal Violet (C.I. 42555), Malachite Green (C.I. No. 42000), Victoria Blue B (C.I. No. 44045) and Neutral Red (C.I. No. 50040) at one to ten percent weight levels, based on the combined weight of resin and sensitizer. The dye additives help provide increased resolution by inhibiting back scattering of light off the substrate.

Anti-striation agents may be used up to a five percent weight level, based on the combined weight of resin and sensitizer.

Plasticizers which may be used include, for example, phosphoric acid tri-($\beta$-chloroethyl)-ester; stearic acid; dicamphor; polypropylene; acetal resins; phenoxy resins; and alkyl resins at one to ten percent weight levels, based on the combined weight of resin and sensitizer. The plasticizer additives improve the coating properties of the material and enable the application of a film that is smooth and of uniform thickness.

Adhesion promoters which may be used include, for example, $\beta$-(3,4-epoxy-cyclohexyl)-ethyltrimethoxysilane; p-methyldisilane-methyl methacrylate; vinyltrichlorosilane; and $\gamma$-amino-propyl triethoxysilane up to a 4 percent weight level, based on the combined weight of resin and sensitizer.

Speed enhancers that may be used include, for example, picric acid, nicotinic acid or nitrocinnamic acid at a weight level of up to 20 percent, based on the combined weight of resin and sensitizer. These enhancers tend to increase the solubility of the photoresist coating in both the exposed and unexposed areas, and thus they are used in applications when speed of development is the overriding consideration even though some degree of contrast may be sacrificed. That is, while the exposed areas of the photoresist coating will be dissolved more quickly by the developer, the speed enhancers will also cause a larger loss of photoresist coating from the unexposed areas.

Solvents into which the light-sensitive composition is dissolved may include xylene, butyl acetate, propylene glycol methyl ether acetate and Cellosolve acetate and mixtures thereof.

Non-ionic surfactants that may be used in the solution containing the light-sensitive composition of this invention include, for example, nonylphenoxy poly(ethyleneoxy) ethanol; octylphenoxy (ethyleneoxy) ethanol; and dinonyl phenoxy poly(ethyleneoxy) ethanol at up to 10 percent weight levels, based on the combined weight of resin and sensitizer.

The prepared photosensitive solution can be applied to a substrate to form a photoresist by any conventional method used in the photoresist art, including dipping, spraying, whirling and spin coating. When spin coating, for example, the resist solution can be adjusted as to the percentage of solids content in order to provide coating of the desired thickness given the type of spinning equipment utilized and the amount of time allowed for the spinning process.

The support for preparing the photoresist of this invention may be any suitable support such as a metal which may be electrochemically or mechanically roughened, such as aluminum and its alloys; plastic films such as polyester or polyolefin; wood; paper; semiconductor materials (i.e., materials which are not conductive unless and until they are doped) such as silicon, gallium arsenide; ceramics; and textiles. Preferably, the support is a silicon-based wafer.

The photoresist coatings produced by the above described procedure are particularly suitable for application to thermally grown silicon/silicon dioxide-coated wafers such as are utilized in the production of microprocessors and other miniaturized integrated circuit components. The substrate may also comprise various polymeric resins especially transparent polymers such as polyesters. The substrate may also comprise doped silicon dioxide, silicon nitride, tantalum, copper, polysilicon, ceramics and aluminum/copper mixtures.

After the photosensitive composition solution is coated onto the substrate, the substrate is baked at approximately 80° to 100° C., until substantially all of the solvent has evaporated and only a thin coating of photoresist composition on the order of a micron in thickness remains on the substrate. The coated substrate can then be exposed to actinic radiatiohn especially ultraviolet radiation in the range of about 350 nm to about 450 nm, produced by use of suitable photomasks, negatives, stencils, templates, projection means, etc. In a more preferred embodiment the uv exposure range is from about 360 nm to about 440 nm.

The exposed resist-coated substrates are next immersed in alkaline developing solution, preferably a potassium based aqueous alkaline solution such as AZ 400K available from American Hoechst Corporation of Somerville, New Jersey. The solution is preferably agitated, for example, by nitrogen burst agitation. The substrates are allowed to remain in the developer until all, or substantially all, of the resist coating has dissolved from the exposed areas.

After removal of the coated wafers from the developing solution, a post-development heat treatment or bake may be employed to increase the coating's adhesion and chemical resistance to etching solutions and other substances as taught by British Pat. No. 1,154,749. The post-development heat treatment can comprise the oven baking of the coating and substrate below the coating's softening point. In industrial applications, particularly in the manufacture of microcircuitry units on silicon/silicon dioxide-type substrates, the developed substrates may be treated with a buffered, hydrofluoric acid etching solution. The resist compositions of the present invention are resistant to such etching solutions and provide effective protection for the unexposed resist-coated areas of the substrate.

The following examples are illustrative of the invention and of the benefits of the light-sensitive composition of the invention as compared to homologous light-sensitive compositions, but it is understood that the invention is not limited thereto.

EXAMPLE 1a–1d 10.0 g of 2,3,4-trihydroxyphenyl heptyl ketone and 32.2 g of naphthoquinone-(1,2)-diazide-(2)-5-sulfonyl chloride are dissolved in enough dioxane to give a 10% solution. With vigorous stirring, 100 ml of 10% aqueous sodium carbonate is slowly added. The solution is stirred an additional two hours at room temperature and then drowned into 2.51 liters of 1N hydrochloric acid. The resulting precipitate is collected by filtration, washed and air dried. The resultant compound is that of formula 1 wherein X is naphthoquinone-(1,2)-diazide-(2)-5-sulfonyl. This process is repeated four times in order to show the consistency of the compositions of this invention.

EXAMPLE 2

The process of Example 1 is repeated, wherein the ketone reactant is 2,3,4-trihydroxyphenyl methyl ketone, in order to produce the compound of formula 1 wherein $(CH_2)_6CH_3$ is substituted by $CH_3$ and X is naphthoquinone-(1,2)-diazide-(2)-5-sulfonyl.

EXAMPLE 3

The process of Example I is repeated, wherein the reactants are 2,3,4-trihydroxyphenyl pentyl ketone and naphthoquinone-(1,2)-diazide-(2)-5-sulfonyl chloride, in order to form the compound of formula 1 wherein $(CH_2)_6CH_3$ is substituted by $(CH_2)_4CH_3$ and X is naphthoquinone-(1,2)-diazide-(2)-5-sulfonyl.

EXAMPLE 4

The process of Example 1 is repeated, wherein the reactants are 2,3,4-trihydroxyphenyl nonyl ketone and naphthoquinone-(1,2)-diazide-(2)-5-sulfonyl chloride, in order to form the compound of formula 1 wherein $(CH_2)_6CH_3$ is substituted by $(CH_2)_8CH_3$ and X is naphthoquinone-(1,2)-diazide-(2)-5-sulfonyl.

EXAMPLE 5

The process of Example 1 is repeated, wherein the reactants are 2,3,4-trihydroxyphenyl undecyl ketone and naphthoquinone-(1,2)-diazide-(2)-5-sulfonyl chloride, in order to form the compound of formula 1 wherein $(CH_2)_6CH_3$ is substituted by $(CH_2)_{10}CH_3$ and X is naphthoquinone-(1,2)-diazide-(2)-5-sulfonyl.

EXAMPLE 6

The process of Example 1 is repeated, wherein the reactants are 2,3,4-trihydroxyphenyl heptadecyl ketone and naphthoquinone-(1,2)-diazide-(2)-5-sulfonyl chloride, in order to form the compound of formula 1 wherein $(CH_2)_6CH_3$ is substituted by $(CH_2)_{16}CH_3$ and X is naphthoquinone-(1,2)-diazide-(2)-5-sulfonyl.

A coating solution is prepared by dissolving naphthoquinone derivatives prepared as described hereinabove, each having a different alkyl ketone group and 26 g of cresol novolak resin in 69 gm of propylene glycol methyl ether acetate followed by filtration. The specific amount of naphthoquinone derivative used in the solution is enough such that the absorbtivity is about 0.75 liters/g-cm. The solution is then spin-coated at 5500 rpm onto a silicon wafer and air dried at 90° C. for 30 minutes.

The thusly prepared photoresists may be evaluated as follows: 9 silicon wafers, each coated with a coating solution containing a naphthoquinone derivative prepared as in Examples 1–6 are each given exposure doses ranging from 30–150 mJ/cm$^2$ (exposure energy). The dose in each case is measured using a radiometer. The photoresist film thickness ($T_o$) for each coated wafer is obtained using a Rudolf Film Thickness Monitor. These wafers are then developed sequentially in AZ 400K developer. The developers have been diluted to a certain normality such that the unexposed photoresist film loss is between 50–150 angstroms per minute in order to maximize photospeed while maintaining an acceptably low erosion rate. The rate of dissolution of the exposed film is monitored by a laser interferometer. From the laser interferometer traces, the photoresist film remaining after one minute development time (T) is determined for each exposure dose. The normalized film thickness remaining (T/T$_o$) is plotted against log (exposure energy) in order to generate a contrast curve as described by G. C. Willson in "Introduction to Microlithography," Chapter 3, p. 105, American Chemical Society, Washington, D.C. 1983. A straight line plot is obtained by extrapolation.

The slope of the straight line is the development contrast of the photoresist and the photospeed is where the line intersects the exposure axis, i.e., the energy required to remove a photoresist film of T$_o$ microns in one minute (the lower value is the faster photospeed).

The nine photoresist compositions prepared as described above are evaluated as in the procedure described herein. In each case the naphthoquinone-(1,2)-diazide-(2)-sulfonyl residue is the naphthoquinone-(1,2)-diazide-(2)-5-sulfonyl residue. The alkyl ketone group is varied in each case as indicated in Table 1. A log exposure curve is generated for each compound evaluated and the resulting contrast and photospeed obtained are shown in Table 1 along with the dilution of the developer for each particular compound.

TABLE 1

| Example | Alkyl Ketone Structure | Contrast | Required Exposure Energy (mJ/cm$^2$) | Developer Strength |
|---------|------------------------|----------|--------------------------------------|--------------------|
| 1a | C$_7$H$_{15}$ | 1.95 | 94 | 1:3 |
| 1b | C$_7$H$_{15}$ | 1.72 | 110 | 1:3 |
| 1c | C$_7$H$_{15}$ | 1.80 | 94 | 1:3 |
| 1d | C$_7$H$_{15}$ | 1.83 | 100 | 1:3 |
| 2 | CH$_3$ | 1.22 | 126 | 1:3.5 |
| 3 | C$_5$H$_{11}$ | 1.40 | 80 | 1:2.8 |
| 4 | C$_9$H$_{19}$ | 1.50 | 92 | 1:2.5 |
| 5 | C$_{11}$H$_{23}$ | 1.84 | 178 | 1:3 |
| 6 | C$_{17}$H$_{35}$ | 1.80 | 165 | 1:2.5 |

It can be readily observed from Table 1 that compounds of the instant invention (Examples 1a–1d) wherein the alkyl ketone is heptyl ketone leads to the production of a photoresist consistently having both excellent contrast and photospeed unlike those of Examples 2–6 wherein the alkyl ketone is methyl, pentyl nonyl, undecyl and heptadecyl ketone respectively. That is, although there is some inconsequential variance, the phenyl heptyl ketone compound is the most effective in substantially maintaining a relatively high contrast while simultaneously requiring a relatively low exposure energy to completely remove the exposed portion of the film (i.e., high photospeed).

What is claimed is:

1. A light sensitive composition comprising a mixture of an alkali soluble resin and a light sensitive component, said light sensitive component consisting essentially of a compound of the formula

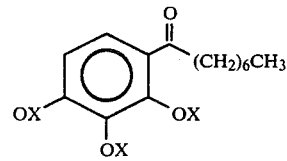

wherein X is a naphthoquinone-(1,2)-diazide-(2)-sulfonyl residue wherein the ratio by weight of said resin to said light-sensitive component is in the range of from about 1:1 to about 10:1.

2. The composition of claim 1 wherein said resin is a hydroxy aryl resin.

3. The composition of claim 2 wherein said resin is a novolak resin.

4. The composition of claim 3 wherein said resin is cresol novolak resin.

5. The composition of claim 2 wherein said resin is a polyvinyl phenol resin.

6. The composition of claim 1 wherein X is a naphthoquinone-(1,2)-diazide-(2)-4-sulfonyl residue.

7. The composition of claim 1 wherein X is a naphthoquinone-(1,2)-diazide-(2)-5-sulfonyl residue.

8. The composition of claim 1 wherein said resin is cresol novolak resin and X is a napthoquinone-(1,2)-diazide-(2)-4-sulfonyl residue.

9. The composition of claim 1 wherein said resin is cresol novolak resin and X is a naphthoquinone-(1,2)-diazide-(2)-5-sulfonyl residue.

10. The composition of claim 8 wherein the ratio by weight of said resin to said naphthoquinone derivative is in the range from about 6:1 to about 10:1.

11. The composition of claim 9 wherein the ratio by weight of said resin to said naphthoquinone derivative is in the range of from about 6:1 to about 10:1.

12. A photoresist which comprises the composition of claim 1 coated on a support.

13. The photoresist of claim 12 wherein said support is selected from the group consisting of a semiconductor material, a metal, a plastic film, wood, paper, ceramics and textiles.

14. The photoresist of claim 12 wherein said support is a silicon-based wafer.

15. The photoresist of claim 13 wherein said support comprises aluminum.

16. The composition of claim 1 further comprising one or more additives selected from the group consisting of colorants, dyes, anti-striation agents, plasticizers, adhesion promoters, speed enhancers, solvents and surfactants.

17. The photoresist of claim 12 wherein said support comprises one or more compounds selected from the group consisting of polyester, polyolefin, silicon, gallium arsenide, silicon/silicon dioxide, doped silicon dioxide, silicon nitride, aluminum/copper mixtures, tantalum, copper and polysilicon.

* * * * *